United States Patent [19]

Okamoto et al.

[11] Patent Number: 4,948,751
[45] Date of Patent: Aug. 14, 1990

[54] MOELCULAR BEAM EPITAXY FOR SELECTIVE EPITAXIAL GROWTH OF III - V COMPOUND SEMICONDUCTOR

[75] Inventors: Akihiko Okamoto; Keiichi Ohata, both of Tokyo, Japan

[73] Assignee: NEC Corporation, Japan

[21] Appl. No.: 196,009

[22] Filed: May 19, 1988

[30] Foreign Application Priority Data

May 20, 1987 [JP] Japan .................. 62-124801

[51] Int. Cl.[5] .................. H01L 21/203; H01L 21/20
[52] U.S. Cl. ........................ 437/107; 148/DIG. 26;
148/DIG. 65; 148/DIG. 97; 148/DIG. 69;
156/610; 437/90; 437/133; 437/939; 437/946;
437/976
[58] Field of Search .................. 148/DIG. 26, 29, 56,
148/65, 72, 97, 150, 160, 169; 156/610-615;
427/248.1, 255.1; 437/81, 83, 89, 90, 99, 105,
107, 112, 126, 133, 936, 939, 943, 946, 949, 970,
976

[56] References Cited

U.S. PATENT DOCUMENTS

| | | |
|---|---|---|
| 3,751,310 | 8/1973 | Cho ........................ 437/107 |
| 3,928,092 | 12/1975 | Bellamy et al. .................. 437/107 |
| 4,111,725 | 9/1978 | Cho et al. .................. 437/99 |
| 4,181,544 | 11/1980 | Cho .................. 156/612 |
| 4,517,047 | 5/1985 | Chang et al. .................. 437/107 |
| 4,622,083 | 11/1986 | Shih .................. 156/610 |
| 4,622,093 | 11/1986 | Tsang .................. 156/610 |
| 4,637,129 | 1/1987 | Derkits, Jr. et al. .................. 437/89 |

FOREIGN PATENT DOCUMENTS

| | | | |
|---|---|---|---|
| 0138382 | 10/1979 | Japan .................. | 437/107 |
| 0066810 | 4/1985 | Japan .................. | 437/107 |

OTHER PUBLICATIONS

Li et al., "Aspects of GaAs Selective Area Growth by Molecular Beam Epitaxy . . .", J. Electrochem. Soc., vol. 130, No. 10, Oct. 1983, pp. 2072-5.
"Journal of Crystal Growth", vol. 77, (1986), pp. 303-309.
"Journal of Applied Physics", vol. 55 (1985), pp. 3163-3165.
"Applied Physics Letters", vol. 48 (1986), pp. 142-144.
"Journal of Electrochemical Society", vol. 127 (1980), pp. 1562-1567.
"Journal of Applied Physics", vol. 46 (1975), pp. 783-785.

Primary Examiner—Brian E. Hearn
Assistant Examiner—William D. Bunch
Attorney, Agent, or Firm—Laff, Whitesel, Conte & Saret

[57] ABSTRACT

A method of selective epitaxial growth includes a step of selectively forming an insulator film on a predetermined region of a semiconductor substrate and a step of evaporating a starting material containing a Group III element in vacuum in the presence of a Group V element to grow epitaxially a III-V compound semiconductor selectively on the semiconductor substrate under the condition where the partial pressure of the Group III element just above the semiconductor substrate is greater than the equilibrium vapor pressure of the Group III element contained in the III-V compound semiconductor existing on the semiconductor substrate and is smaller than the equilibrium vapor pressure of the Group III element contained in the III-V compound semiconductor existing on the insulator film.

When InAs is grown epitaxially and selectively on a GaAs substrate, the GaAs substrate is kept at 500° to 650° C. and when GaAs is grown epitaxially and selectively on the GaAs substrate, the GaAs substrate is kept at 700° to 775° C.

21 Claims, 6 Drawing Sheets

MOELCULAR BEAM EPITAXY FOR SELECTIVE EPITAXIAL GROWTH OF III - V COMPOUND SEMICONDUCTOR

BACKGROUND OF THE INVENTION

The present invention relates to molecular beam epitaxy (MBE) for selective epitaxial growth of a semiconductor film on a compound semiconductor substrate and more particularly, to a method of selective epitaxial growth of III-V compound semiconductor film by molecular beam epitaxy.

DESCRIPTION OF THE PRIOR ART

Selective epitaxial growth to form an epitaxial semiconductor layer only on a semiconductor substrate and not on an insulator film is useful in manufacturing compound semiconductor devices such as laser diodes, photo-sensing devices and field effect transistors. It is known that selective epitaxial growth can be achieved by liquid phase epitaxy (LPE), vapor, phase epitaxy (VPE) and metal organic molecular beam epitaxy (MOMBE), as disclosed in "Journal of Crystal Growth", Vol. 77 (1986), pp. 303–309 and in "Journal of Applied Physics", Vol. 55 (1985), pp. 3163–3165. It has not been considered that MBE can be used for the selective epitaxial growth.

In MBE, starting materials are placed in crucibles made of boron nitride or the like, and heated to be evaporated. A crystal substrate is disposed in such a manner as to face the crucibles, and the molecules of the starting materials are evaporated from the crucibles to the crystal substrate to form an epitaxially grown film thereon. In the molecular beam epitaxy of the III-V compound semiconductors, the thickness of the grown film is controlled by controlling the supply quantity of the Group III elements while supplying excessively the Group V elements. The Group V element is supplied in excess, because its sticking coefficient of the Group V element is small. On the other hand, since the sticking coefficient of the Group III element is substantially "1", all the molecules of the Group III element reaching the substrate stick to the substrate and combine with the Group V element existing excessively around the substrate to thereby form III-V compound film. As described above, MBE is a crystal growth method under the non-equilibrium condition in which all the molecules of the Group III element reaching the substrate is deposited to the substrate, and it is essentially different from LPE, VPE and MOMBE in which the equilibrium is established between a solid phase and a liquid phase or between a solid phase and a gas phase. For this reason, it has been, heretofore, thought that selective epitaxial growth of a semiconductor layer only on the semiconductor substrate without depositing on an insulator film is not achieved by MBE. For instance, "Journal of Crystal Growth", Vol. 77 (1986) reported the above scientific thought on page 303, stating that "for GaAs, the most extensively studied semiconductor, selective growth is not possible with classical MBE, which uses elemental Ga and As as starting materials, since in this case also the masking layer becomes covered with GaAs, albeit in the form of a polycrystalline film"

Using the impossibility of the selective growth by MBE, polycrystalline GaAs is positively grown by MBE on the insulator, as reported in "Applied Physics Letters", Vol. 48 (1986), pp. 142–144, "Journal of Electrochemical Society", Vol. 127 (1980), pp. 1562–1567 and "Journal of Applied Physics", Vol. 46 (1975), pp. 783–785.

SUMMARY OF THE INVENTION

It is, therefore, an object of the present invention to provide a method of selective epitaxial growth using molecular beam epitaxy.

It is another object of the present invention to provide a method of selective epitaxial growth for manufacturing III-V compound semiconductor devices.

The selective epitaxial growth method in accordance with the present invention includes steps of forming selectively an insulator film on the surface of a semiconductor substrate and performing selective epitaxial growth of a III-V compound semiconductor on the semiconductor substrate in the presence of a Group V element by evaporating starting materials containing a Group III element under the condition that the partial pressure of the Group III element just above the semiconductor substrate is greater than the equilibrium vapor pressure of the Group III element contained in the III-V compound semiconductor existing on the semiconductor substrate and is smaller than the equilibrium vapor pressure of the Group III element contained in the III-V compound semiconductor existing on the insulator film.

The III-V compound semiconductor may be deposited both on the semiconductor substrate and on the insulator film if the equilibrium vapor pressure of the Group III element just above the semiconductor substrate is greater than both the equilibrium vapor pressure of the Group III element contained in the III-V compound semiconductor existing on the semiconductor substrate and that of the Group III element contained in the III-V compound semiconductor existing on the insulator film.

In MBE using solid-state starting materials, the Group V materials are supplied excessively and the growth rate is controlled by the supply quantity of the Group III materials. The crystal growth rate is proportional to $$P - P_{eq.}$$

where P is the partial pressure of the Group III element supplied by the incident molecular beam and $P_{eq.}$ is the equilibrium vapor pressure of the Group III element contained in the III-V compound semiconductor existing on the heated semiconductor substrate.

In the conventional MBE, the substrate temperature has been set so that the equilibrium vapor pressure $P_{eq.}$ is sufficiently smaller than the partial pressure P. Accordingly, the Group III elements arriving at the substrate are all deposited onto the semiconductor substrate and selective growth could not be performed.

In the present invention, for example, the substrate temperature, is set at a relatively higher temperature than in the prior art technique so as to increase $P_{eq.}$. When $P_{eq.}$ is greater than P, crystal growth does not occur. When the substrate is made of a III-V compound semiconductor where its Group III element is the same as the Group III element supplied by the incident molecular beam and $P_{eq.}$ is greater than P, the substrate undergoes decomposition and etching.

There is the difference between the equilibrium vapor pressure of the Group III element contained in the III-V compound semiconductor existing on the semiconductor substrate and that of the Group III element contained in the III-V compound semiconductor existing on the insulator film formed on the semiconductor substrate. Utilizing this difference, in the present invention, the partial pressure of the Group III element is selected so that $P-P_{eq}$ is positive above the semiconductor substrate but is negative above the insulator film, and the III-V compound semiconductor layer is formed selectively on the semiconductor substrate. Such an equilibrium vapor pressure of the Group III element can be controlled by the substrate temperature.

Moreover, the III-V compound semiconductor film can be formed simultaneously both on the semiconductor substrate and on the insulator film by setting the partial pressure P of the Group III element above the semiconductor substrate and above the insulator film higher than $P_{eq}$.

Furthermore, when the substrate is made of the III-V compound semiconductor, selective etching of the substrate becomes possible by making the partial pressure of the Group III element just above the substrate smaller than the equilibrium vapor pressure of the Group III element contained in the compound semiconductor substrate.

According to the present invention, the selective growth can be performed by use of the solid-state starting material of Group III element, and it is not necessary to use dangerous and precious organometallic compounds that have been used in organometallic vapor phase epitaxy (OMVPE) or to employ complicated temperature control system using two zones that has been used in hydride or chloride vapor phase epitaxy. Moreover, since the selective epitaxial growth according to the present invention can be practised fundamentally in molecular beam epitaxy, high uniformity and high controllability of MBE can be maintained.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS (First Embodiment)

Figure 1:
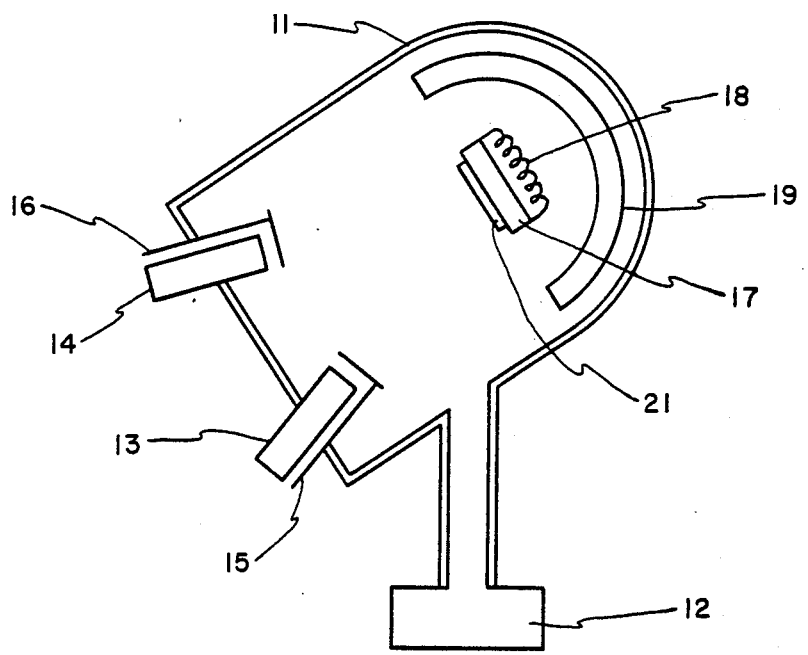
FIG. 1 is a sectional view of the molecular beam epitaxy apparatus used for the first to sixth embodiments of the present invention.
Figure 2A:
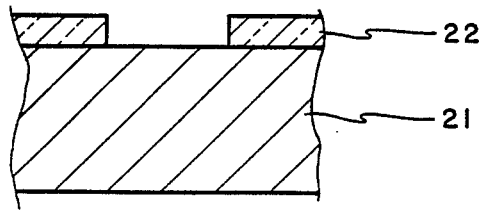
FIGS. 2(a) and 2(b) are selectional views for explaining the first and second embodiments of the present invention.
Figure 2B:
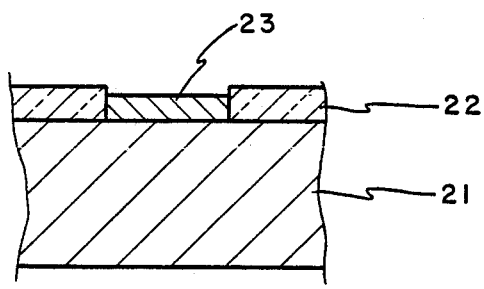

Referring to FIG. 1, FIG. 2(a) and FIG. 2(b), a (100)-oriented Cr-doped semi-insulating GaAs substrate 21 was partly covered with $SiO_2$ 22 having a thickness of 200 to 500 nm by chemical vapor deposition before introducing the substrate 21 into an MBE chamber 11 equipped with a liquid nitrogen shroud 19. Then, the patterned GaAs substrate 21 was dipped into HCl for one minute to eliminate GaAs native oxide. Next, the GaAs substrate 21 was rinsed in deionized water. The GaAs substrate 21 was then mounted on a substrate holder 17 made of Mo.

After the chamber 11 was evacuated to a vacuum below $5 \times 10^{-10}$ Torrs by a vacuum pump 12, an effusion cell 13 of As and an effusion cell 14 of In were kept 200° C. and 700° C., respectively, with shutters 15 and 16 closed. Both the effusion cells 13 and 14 were made of boron nitride. Before the growth, the substrate 21 was heated up to 650° C. by a heater 18 so as to remove GaAs native oxide again, and then settled to the growth temperature, of from 500° to 650° C. The growth was carried out, under the back pressure lower than $5 \times 10^{-10}$ Torrs, for an hour by opening the shutters 15 and 16. Then, the shutter 16 was closed to cut off the In flux, resulting in stopping the crystal growth. Next, the substrate 21 was cooled down with the shutter 15 opened to prevent In evaporation from the grown InAs 23.

The thickness was estimated from the InAs layer 23 by a surface profiler with a metal probe. The morphology of the InAs layer 23 was studied by optical microscopy and scanning electron microscopy.

Figure 3:
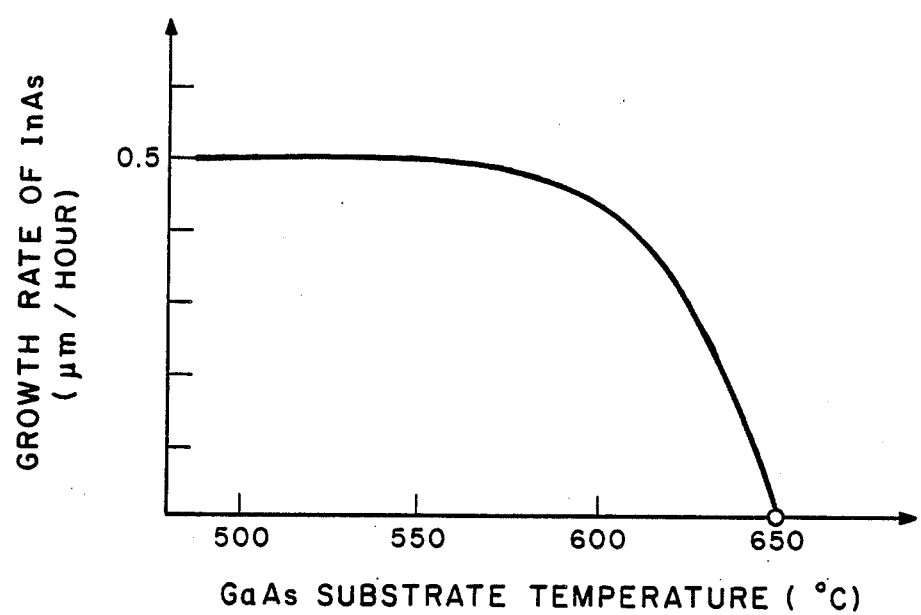
FIG. 3 is a diagram showing a relationship between the growth rate of an InAs layer and the temperature of a GaAs substrate.

FIG. 3 shows the crystal growth rate when InAs 23 was formed on the GaAs substrate 21 in the manner described above. In the diagram, the abscissa represents the temperature of the GaAs substrate and the ordinate, the growth rate. It can be understood that when the growth temperature rises, the growth rate on the GaAs substrate 21 decreases and the re-evaporation rate of In increases.

FIG. 2(b) shows the result of the growth of InAs at the growth temperature of from 500° to 650° C. on the GaAs substrate 21 on which $SiO_2$ 22 was formed selectively as shown in FIG. 2(a). InAs 23 was formed only on the GaAs substrate 21, and was not deposited on $SiO_2$ 22.

On the other hand, when the substrate temperature was set below 500° C., InAs was deposited also on the entire surface of silicon dioxide 22 in the polycrystalline state. Such a growth could be observed when the substrate temperature was lowered to the room temperature. On the other hand, when the substrate temperature was higher than 650° C., nothing was formed on the GaAs substrate 21. Satisfactory selective growth could be observed when the growth temperature was from 550° to 600° C. When the surface of the silicon dioxide 22 was not cleaned sufficiently, polycrystalline InAs was liable to be deposited on $SiO_2$ 22 within the substrate temperature range of from 500° to 550° C. Within the temperature range of 600° to 650° C., the surface of the GaAs substrate 21 reacted with InAs 23 and the interface became dull, and surface morphology of InAs 23 also dropped.

InAs is a valuable semiconductor material which has narrower band gap of 0.32 eV, higher electron mobility and the capability of being doped at higher concentration than GaAs. Therefore, the material is applied not only for monolithic devices, such as Hall devices, infrared detectors and lasers, but also for contact material to achieve a low ohmic contact to other III-V compound semiconductors, such as GaAs or GaAlAs.

(Second Embodiment)

Figure 4:
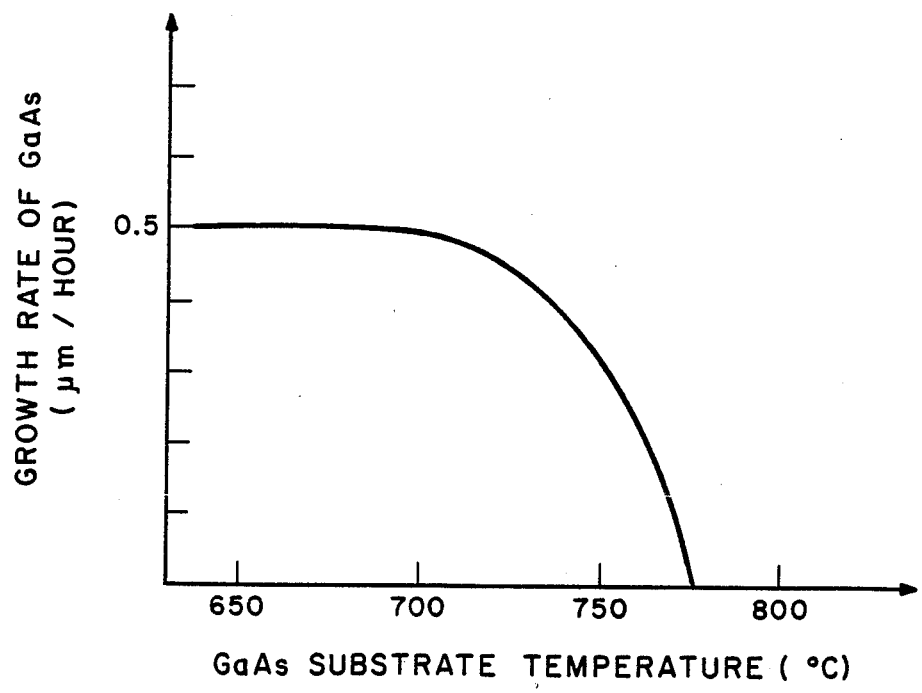
FIG. 4 is a diagram showing the growth rate of the GaAs layer and the temperature of the GaAs substrate.

Referring to FIG. 2(a), a SiO₂ pattern 22 having a thickness of 200 to 500 nm was first formed on the GaAs substrate 21 in the same way as the first embodiment. Referring to FIG. 1, the GaAs substrate 21 was then introduced into the molecular beam epitaxy chamber 11. The surface of the GaAs substrate 21 was cleaned in the same way as in the first embodiment. The As effusion cell 13 and the Ga effusion cell 14 were kept at 200° C. and 1,000° C., respectively. The growth was carried out for an hour by opening the shutters 15 and 16. The shutter 16 was then closed to cut off the Ga flux, resulting in stopping the growth. Next, the substrate 21 was cooled down with the shutter 15 opened to prevent Ga evaporation from the grown GaAs 23. FIG. 4 shows the crystal growth rate when GaAs 23 was thus formed on the GaAs substrate 21. It could be understood that when the growth temperature rises, the growth rate decreases and the re-evaporation rate of Ga increases in the same way as the case of InAs in the first embodiment.

FIG. 1(b) shows the result of the growth of GaAs on the GaAs substrate 21 on which SiO₂ 22 was formed selectively as shown in FIG. 1(a) at a substrate temperature of from 700° to 775° C. GaAs 23 was formed on the GaAs substrate 21 but was not deposited on the SiO₂ 22 in the same way as InAs of the first embodiment. On the other hand, when the substrate temperature was below 700° C., GaAs was deposited in the polycrystalline form also on the entire surface of SiO₂ 22. When the substrate temperature was above 775° C., nothing was formed on GaAs. Satisfactory selective growth was possible within the growth temperature range of from 700° to 750° C. Within the temperature range of from 750° to 775° C., the surface morphology of the GaAs epitaxial layer got deteriorated.

(Third Embodiment)

Figure 5A:
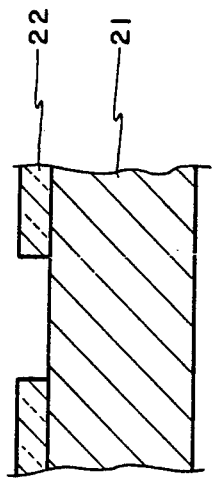
FIGS. 5(a) to 5(c) are sectional views explaining the third and fourth embodiments of the present invention.
Figure 5B:
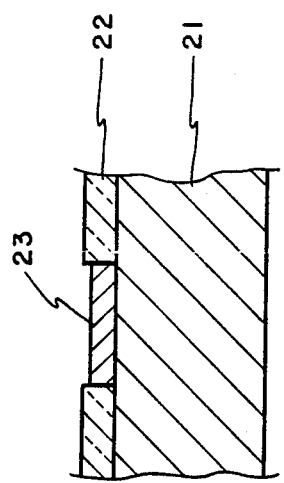
Figure 5C:
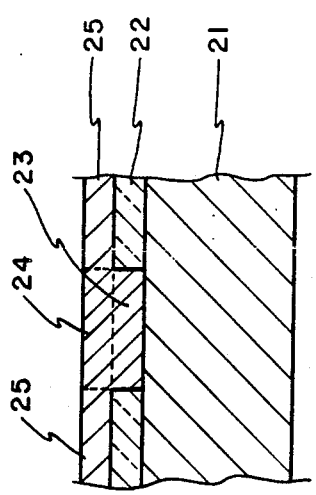

Referring to FIG. 5(a), SiO₂ 22 was formed on the GaAs substrate 21 in the same way as in the first embodiment. Referring to FIG. 1, then, the GaAs substrate 21 was introduced into the MBE chamber 11. The surface of the GaAs substrate 21 was cleaned in the same way as in the first embodiment, and the As effusion cell 13 and the In effusion cell 14 were kept at 200° and 750° C., respectively. After the substrate was heated to 600° C., the shutters 15 and 16 were opened and InAs 23 was grown selectively on the substrate 21. When the film thickness of InAs 23 became equal to that of SiO₂ 22, the indium flux was cut off by the shutter 16. FIG. 5(b) is a sectional view showing the state at this time. The substrate temperature was immediately lowered to 500° C. or below and kept at that temperature. The shutter 16 for indium was opened again to form InAs. FIG. 5(c) is a sectional view showing the state at this time. Single crystal InAs 24 was formed on the GaAs substrate 21 while polycrystal InAs 25 was formed on SiO₂ 22, and the crystal surface was made flat.

Thereafter the shutter 16 was closed so as to cut off the Ga flux and to stop the growth. Next, the substrate 21 was cooled down with the shutter 15 opened to prevent In evaporation from the growth InAs 23, 24 and 25

In the semiconductor device thus flattened, the surface step was extremely small and disconnection of wirings did not occur.

(Fourth Embodiment)

Referring to FIG. 5(a), SiO₂ 22 was formed on the GaAs substrate 21 in the same way as in the first embodiment. Referring to FIG. 1, the GaAs substrate 21 was then introduced into the MBE chamber 11. The surface of the GaAs substrate 21 was cleaned in the same way as in the first embodiment, and the As effusion cell 13 and the Ga effusion cell 14 were kept at 200° C. and 1,000° C., respectively. After the substrate was heated to 700° C., the shutters 15 and 16 were opened and GaAs 23 was selectively formed on the substrate 21. When the film thickness of this GaAs 23 became equal to that of SiO₂ 22 as shown in FIG. 5(b), the Ga flux was cut off by the shutter 16. Immediately thereafter, the substrate temperature was lowered to 675° C. or below and kept at that temperature. The As shutter 16 was opened once again so as to form GaAs 24 and 25. FIG. 5(c) is a sectional view showing the state at this time. The surface was made flat in the same way as in the third embodiment. Next, the shutter 16 was closed to cut off the Ga flux and to stop the growth, and then the substrate 21 was cooled down with the shutter 15 opened so as to prevent Ga evaporation from the grown GaAs 23, 24 and 25.

(Fifth Embodiment)

Figure 6A:
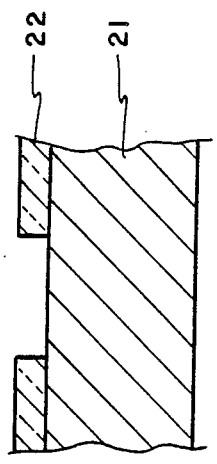
FIGS. 6(a) to 6(c) are sectional views for explaining the fifth and sixth embodiments of the present invention.

Referring to FIG. 6(a), SiO₂ 22 was formed on the GaAs substrate 21 in the same way as in the first embodiment. Referring to FIG. 1, the GaAs substrate 21 was then introduced into the MBE chamber 11. The surface of the GaAs substrate 21 was cleaned in the same way as in the first embodiment, and the As effusion cell 13 and the In effusion cell 14 were kept at 200° C. and 750° C., respectively.

Figure 6B:
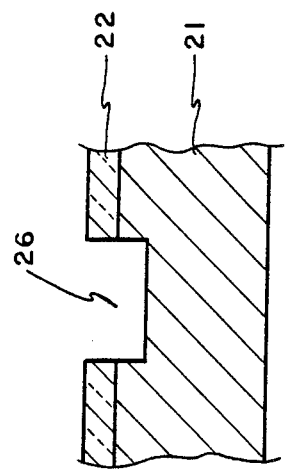

First, while As alone was being radiated by opening the shutter 15, the substrate 21 was heated to 770° C. and the portion of the substrate 21 which was not covered with SiO₂ 22 was etched thermally to form a trench 26 as shown in FIG. 6(b). Next, the substrate temperature was kept at 600° C. and In and As were radiated in the same way as in the first embodiment to form InAs 27 selectively in the trench 26 as shown in FIG. 5(c).

(Sixth Embodiment)

Referring to FIG. 6(a), SiO₂ 22 was formed on the GaAs substrate 21 in the same way as in the first embodiment. Referring to FIG. 1, the GaAs substrate 21 was then introduced into the MBE chamber 11. The surface of the GaAs substrate 21 was cleaned in the same way as in the first embodiment, and the As effusion cell 13 and the Ga effusion cell 14 were kept at 200° C. and 1,000° C., respectively.

Figure 6C:
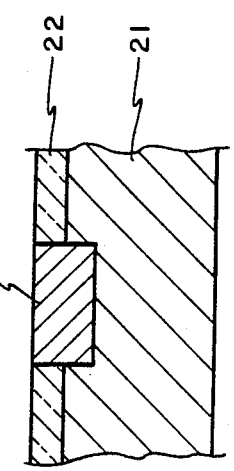

First, while As alone was being radiated by opening the shutter 15, the substrate 21 was heated to 770° C. and the portion of the substrate 21 which was not covered with SiO₂ 22 was etched thermally as shown in FIG. 6(b) to form a trench 26. Next, while the substrate temperature was kept at 700° C., Ga and As were radiated in the same way as in the first embodiment so as to form GaAs 27 selectively on the substrate 21. The GaAs epitaxial layer 27 was thus buried in the trench 26 as shown in FIG. 6(c).

The foregoing embodiments represent the cases where InAs and GaAs were grown selectively on the GaAs substrate having SiO₂, but selective growth can be carried out in the same way by using other compound semiconductor materials and other insulator films such as silicon nitride.

Table 1 illustrates the relation between the compound semiconductor materials grown on the semiconductor substrate and the substrate temperature. The partial pressure of the Group III elements supplied from the effusion cell for the Group III elements is the quantity corresponding to the growth rate of 1.7 μm/hr and the partial pressure of the Group V elements is sufficiently greater than that of the Group III elements. In the table 1, the case where SiO$_2$ was used as the insulator film on the compound semiconductor substrate, the same result could be obtained by using silicon nitride instead of SiO$_2$.

TABLE 1

| Semiconductor Materials | Temperature A (°C.) | Temperature B (°C.) | Temperature C (°C.) |
|---|---|---|---|
| InSb | below 470 | above 570 | 470-570 |
| InP | below 470 | above 570 | 470-570 |
| GaSb | below 600 | above 720 | 600-720 |
| GaP | below 650 | above 720 | 650-720 |

NOTE:
Temperature A: temperature where growth occurs both on the semiconductor substrate and on the insulator film.
B: temperature where deposition does not occur.
C: temperature where selective growth occurs.

When Ga-containing compound semiconductors are grown, the temperature of the Ga effusion cell is preferably from 1,000° to 1,200° C. and when In-containing compound semiconductors are grown, the temperature of the In effusion cell is preferably from 700° to 1,000° C.

What is claimed is:

1. A method of selective epitaxial growth comprising:
   a first step of selectively forming an insulator film on a surface of semiconductor substrate; and
   a second step of performing selective epitaxial growth of a III-V compound semiconductor on the exposed area of said surface of said semiconductor substrate without growing said III-V compound semiconductor on said insulator film by evaporating the Group III element of said III-V compound semiconductor in the presence of a Group V element under a condition where a partial pressure of said Group III element just above said semiconductor substrate and said insulator film is greater than a first equilibrium vapor pressure of said Group III element contained in said III-V compound semiconductor existing on said semiconductor substrate and is smaller than a second equilibrium vapor pressure of said Group III element contained in said III-V compound semiconductor existing on said insulator film.

2. The method of selective epitaxial growth as claimed in claim 1, further comprising a third step of depositing said III-V compound semiconductor both above said semiconductor substrate and on said insulator film by evaporating said Group III element in the presence of said Group V element under a condition where a partial pressure of said Group III element just above said semiconductor substrate and said insulator film is greater than both a third equilibrium vapor pressure of said Group III element contained in said III-V compound semiconductor existing on said semiconductor substrate and a forth equilibrium vapor pressure of said Group III element contained in said III-V compound semiconductor existing on said insulator film.

3. The method of selective epitaxial growth as claimed in claim 1, wherein said semiconductor substrate is a GaAs substrate and said III-V compound semiconductor is InAs.

4. The method of selective epitaxial growth as claimed in claim 1, wherein said semiconductor substrate is a GaAs substrate and said III-V compound semiconductor is GaAs.

5. The method of selective epitaxial growth as claimed in claim 3, wherein said condition where said partial pressure of said Group III element just above said semiconductor substrate and said insulator film is greater than said first equilibrium vapor pressure of said Group III element contained in said III-V compound semiconductor existing on said semiconductor substrate and is smaller than said second equilibrium vapor pressure of said Group III element contained in said III-V compound semiconductor existing on said insulator film in a condition where a temperature of said semiconductor substrate is from 500° to 650° C.

6. The method of selective epitaxial growth as claimed in claim 4, wherein said condition where said partial pressure of said Group III element just above said semiconductor substrate and said insulator film is greater than said first equilibrium vapor pressure of said Group III element contained in said III-V compound semiconductor existing on said semiconductor substrate and is smaller than said second equilibrium vapor pressure of said Group III element contained in said III-V compound semiconductor existing on said insulator film, in a condition where a temperature of said semiconductor substrate is from 700° to 775° C.

7. The method of selective epitaxial growth as claimed in claim 1, wherein said insulator film is silicon oxide or silicon nitride.

8. A method of manufacturing semiconductor devices comprising:
   a first step of selectively forming an insulating film on a predetermined region of a first III-V compound semiconductor substrate;
   a second step of epitaxially growing a second III-V compound semiconductor selectively on said first III-V compound semiconductor substrate without growing said second III-V compound semiconductor on said insulating film by evaporating the Group III element of said second III-V compound semiconductor in the presence of a Group V element under a condition where a partial pressure of said Group III element just above said first III-V compound semiconductor substrate and said insulating film is greater than a first equilibrium vapor pressure of said Group III element contained in said second III-V compound semiconductor substrate and is smaller than a second equilibrium vapor pressure of said Group III element contained in said second III-V compound semiconductor existing on said insulator film; and
   a third step of forming a semiconductor device in said second III-V compound semiconductor.

9. The method of manufacturing semiconductor devices as claimed in claim 8, wherein said first III-V compound semiconductor substrate is a GaAs substrate and said second III-V compound semiconductor is InAs.

10. The method of manufacturing semiconductor devices as claimed in claim 8, wherein said first III-V compound semiconductor substrate is a GaAs substrate and said second III-V compound semiconductor is GaAs.

11. The method of manufacturing semiconductor devices as claimed in claim 9, wherein said condition where said partial pressure of said Group III element just above said first III-V compound semiconductor substrate and said insulating film is greater than said first equilibrium vapor pressure of said Group III element contained in said second III-V compound semiconductor substrate and is smaller than said second equilibrium vapor pressure of said Group III element contained in said second III-V compound semiconductor existing on said insulator film, in a condition where a temperature of said first III-V compound semiconductor substrate is from 500° to 650° C.

12. The method of manufacturing semiconductor devices as claimed in claim 10, wherein said condition where said partial pressure of said Group III element just above said first III-V compound semiconductor substrate and said insulating film is greater than said first equilibrium vapor pressure of said Group III element contained in said second III-V compound semiconductor existing on said first III-V compound semiconductor substrate and is smaller than said second equilibrium vapor pressure of said Group III element contained in said second III-V compound semiconductor existing on said insulator film in a condition where a temperature of said first III-V compound semiconductor substrate is from 700° to 775° C.

13. The method of manufacturing semiconductor devices as claimed in claim 8, wherein said insulator film is silicon oxide or silicon nitride.

14. A method of manufacturing semiconductor devices comprising:
    a first step of forming, on a first material where a Group III element contained in a III-V compound semiconductor to be growth thereon has a first equilibrium vapor pressure, a second material where said Group III element contained in said III-V compound semiconductor to be grown thereon has a second equilibrium vapor pressure larger than said first equilibrium vapor pressure;
    a second step of epitaxially growing said III-V compound semiconductor selectively on said first material without growing said III-V compound semiconductor on said second material by evaporating said Group III element in the presence of a Group V element under the condition where the partial pressure of said Group III element just above said first and second materials is greater than said first equilibrium vapor pressure and is smaller than said second equilibrium vapor pressure; and
    a third step of forming a semiconductor electrical element on said selectively grown III-V compound semiconductor.

15. The method of manufacturing semiconductor devices as claimed in claim 14, wherein said first material is a single crystal having a lattice constant which is approximate to that of said III14 V compound semiconductor.

16. The method of manufacturing semiconductor devices as claimed in claim 14, wherein said first material is a III-V compound semiconductor.

17. The method of manufacturing semiconductor devices as claimed in claim 16, wherein said first material is GaAs.

18. The method of manufacturing semiconductor devices as claimed in claim 14, wherein said III-V compound semiconductor is GaAs.

19. The method of manufacturing semiconductor devices as claimed in claim 14, wherein said III-V compound semiconductor is InAs.

20. The method of manufacturing semiconductor devices as claimed in claim 14, wherein said second material is an insulator film.

21. The method of manufacturing semiconductor devices as claimed in claim 14, wherein said second material is silicon oxide or silicon nitride.

* * * * *